United States Patent [19]
Adams et al.

[11] 3,976,329
[45] Aug. 24, 1976

[54] VACUUM BRAKING SYSTEM FOR SEMICONDUCTOR WAFERS

[75] Inventors: Anthony L. Adams, Richardson; Troy D. Moore, Garland, both of Tex.

[73] Assignee: Texas Instruments Incorporated, Dallas, Tex.

[22] Filed: Sept. 9, 1974

[21] Appl. No.: 504,644

[52] U.S. Cl. ................................. 302/2 R; 193/40; 226/95; 226/97; 226/195; 271/195; 271/229; 302/31
[51] Int. Cl.² ................. B65G 51/02; B65G 53/58
[58] Field of Search ................ 302/2 R, 29, 31; 214/1 BE; 271/195, 229, 231; 193/35 A, 40; 226/95, 97, 195

[56] References Cited
UNITED STATES PATENTS

| | | | |
|---|---|---|---|
| 3,293,414 | 12/1966 | Barcia | 302/2 R |
| 3,588,176 | 6/1971 | Byrne et al. | 302/2 R |
| 3,603,646 | 9/1971 | Leoff | 302/29 |
| 3,717,381 | 2/1973 | Hagler | 302/31 |
| 3,718,371 | 2/1973 | Lasch | 302/31 |

*Primary Examiner*—John J. Love
*Assistant Examiner*—Jeffrey V. Nase
*Attorney, Agent, or Firm*—Harold Levine; James T. Comfort; James O. Dixon

[57] ABSTRACT

An improved braking system comprising inlets imbedded flush with an air track surface with the elongated portions thereof parallel to the direction of wafer travel. The inlets are connected to a controlled vacuum source preferably by means of pressure regulating passageways communicating with both ends of each inlet. When vacuum is applied to the inlets, a traveling wafer passing over and substantially covering the elongated inlets is pulled uniformly and evenly down by vacuum action, so that substantially the entire bottom surface of the wafer contacts the track simultaneously. Thus, the wafer comes to rest at a single position within the braking station, irrespective of the original direction of wafer travel.

21 Claims, 6 Drawing Figures

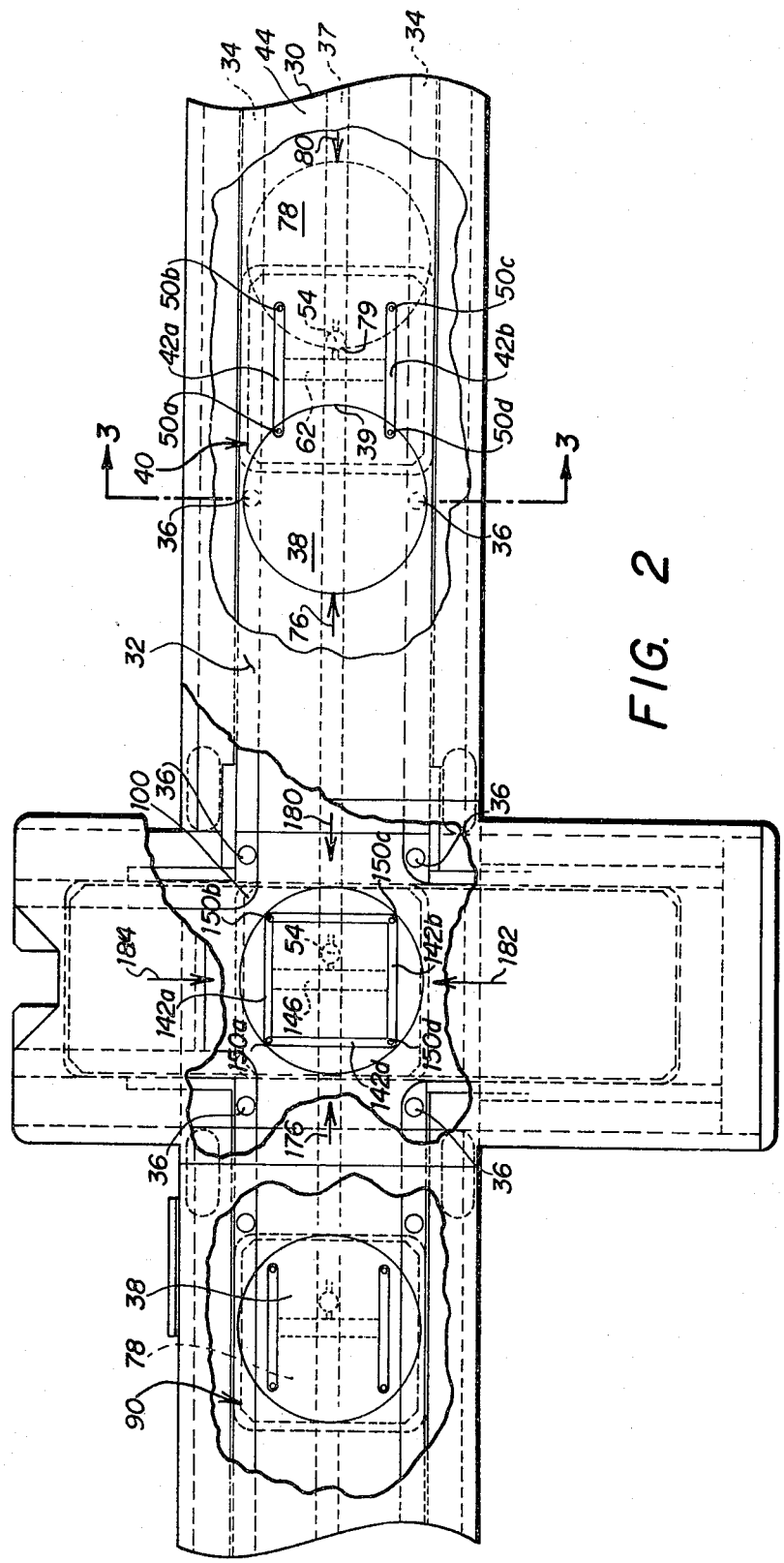
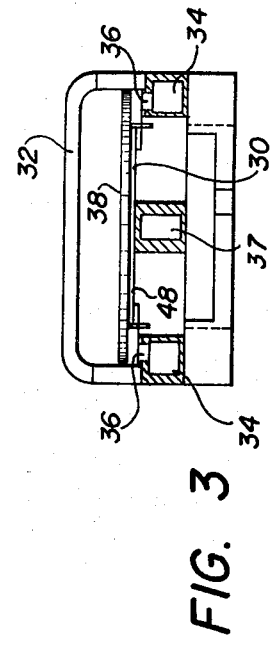
FIG. 2
FIG. 3

VACUUM BRAKING SYSTEM FOR SEMICONDUCTOR WAFERS

This invention relates to vacuum braking systems for arresting the travel of semiconductor wafers being pneumatically conveyed, and more particularly, for evenly and uniformly stopping the travel of a semiconductor wafer at a single position within a braking station irrespective of the direction of wafer travel.

Pneumatic conveyance systems are widely used to convey very thin semiconductor wafers during testing operations, manufacturing operations, and the like. Such wafers, having a thickness of only about 20 mils (0.020 inches) are transported by pneumatic conveyors to prevent both breakage and contamination. Pneumatic conveyors can be generally characterized as haivng an air track surface containing a plurality of imbedded gas outlets. The outlets issue a sufficient pressurized gas flow to slightly lift the wafers to be conveyed, and thereafter create a continuous cushion upon which the wafers ride. The gas normally utilized in such systems is air, but may be for example, inert gases when special conditions so require.

The wafers riding upon the cushion may be caused to travel horizontally along the track by, for example, inclining the track slightly or imparting a force to the wafer having a component extending parallel to the track surface. Because the friction of such a conveyance system is almost nonexistent, the conveyed wafers once in motion, will continue until an opposite force is applied or the gas cushion removed.

One means for arresting the travel of a pneumatically conveyed wafer employs a vacuum braking system. The vacuum braking systems heretofore known include two small circular orifices disposed perpendicularly to the direction of wafer movement on the air track. The orifices communicate with a vacuum source to create a vacuum action or negative pressure differential about the mouth of the orifice. The leading edge of a wafer passing over the orifices is thus pulled down by vacuum action onto the track. The wafer coming into contact with the track is stopped and held by the vacuum action until released.

This system, while effective in stopping the wafer, suffers from two inherent disadvantages. First, the leading edge of the traveling wafer is pulled downwardly as it passes within the vicinity of the orifices. Thus tilted and pulled downward, the wafer contacts the track with its leading edge. The contact between the leading edge and the air track, although stopping the wafer, tends to wear a crescent shaped groove in the track and to chip the leading edge of the wafer. Since the conveyed wafers are expensive to manufacture, wafer breakage is costly. Additionally, the wafer chips are a contaminant in the system.

Second, because the wafer is stopped as the leading edge contacts the track, the position of the finally arrested wafer depends upon the direction of travel. A wafer passing from right to left over the orifices is stopped with the majority of the wafer to the right of the orifices. Conversely, a wafer traveling in the opposite direction is stopped with the majority of the wafer on the left of the orifices. Since operations performed on the conveyed wafers can require very exact positioning, a single pneumatic track could not convey wafers in more than one direction.

The present invention broadly provides a method for evenly and uniformly stopping a pneumatically conveyed semiconductor wafer at a single position within a braking station on an air track, irrespective of the direction of wafer travel, by applying sufficient vacuum action to substantially the entire undersurface of the wafer to be stopped to contact simultaneously substantially the entire undersurface with the track.

According to the invention, there is provided a vacuum braking system comprising a pair of elongated air inlets disposed within a braking station on an air track. The elongated portion of each of the air inlets is substantially parallel to the direction of wafer travel on the air track and is of a length slightly less than the length of the wafer disposed directly over the inlet when the wafer is stopped. The inlets communicate with a vacuum source through a valve structure for selectively activating the braking station.

According to a particular embodiment of the invention, the gas flow through the inlets is regulated by restrictive passageways communicating between a vacuum manifold and the ends of the elongated air inlets. Preferably, the restrictive passageways are tubular, being disposed vertically within the air track. The passageways are effective in maintaining substantially constant vacuum at the mouth of each inlet.

According to another embodiment of the invention, a braking station disposed centrally of an intersection of two air tracks includes two sets of elongated air inlets disposed perpendicular to one another within the intersection to form a square inlet. Restrictive passageways communicate between the corners of the square inlet and the vacuum manifold. Thus, a wafer traveling in either direction on the intersecting tracks will be stopped at a single position within the activated station.

The invention and further advantages thereof will best be understood by reference to the following detailed description of an illustrative embodiment taken in conjunction with the accompanying drawings in which:

FIG. 2 is a plan view of an embodiment of the invention wit portions of the cover cut away;

FIG. 3 is an elevated sectional end view of the apparatus in FIG. 2 taken along line 3—3;

Figure 1:
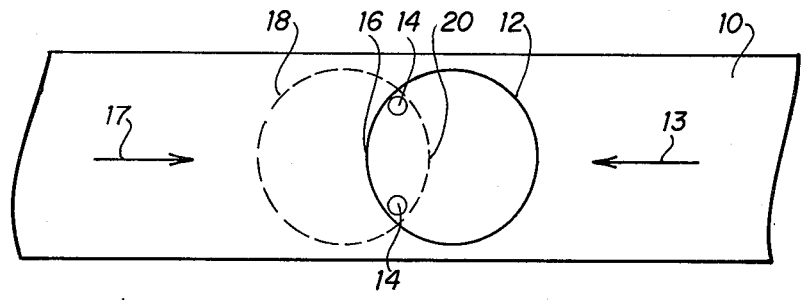
FIG. 1 is a diagrammatic representation of the device heretofore known for stopping semiconductor wafers in a pneumatic conveyance system.

Referring now to the drawings and specifically FIG. 1, there is illustrated generally the prior art system employed to vacuum brake a pneumatically conveyed semiconductor wafer. Air track 10, containing a plurality of air outlets (not shown) for generating an air cushion on a track, is separated from a semiconductor wafer 12 by means of the air cushion generated (not shown). A pair of circular orifices 14 communicating with a controlled vacuum source (not shown) are disposed flush with the surface of track 10 in a spaced apart relationship, perpendicular to the direction of wafer travel. As the traveling wafer 12 advances toward the orifices 14 in the direction indicated by arrow 13, the leading edge 16 is pulled down by vacuum action to contact the surface of air track 10. Wafer 12 is stopped as the leading edge 16 contacts the surface of air track 10. Stopped wafer 12 is pulled onto the track coming to rest in the position indicated by the solid circle in FIG. 1.

Alternatively, wafer 18 is pneumatically conveyed on the track 10 in the direction indicated by arrow 17 in a manner similar to wafer 12, as previously described. The wafer 18 has a leading edge 20. As the wafer 18 advances toward the orifices 14, the leading edge 20 is pulled down by vacuum action to contact air track 10. Wafer 18 is stopped by the contact of the leading edge 20 with the air track 10. The stopped wafer 18 is pulled down onto track 10 coming to rest in the position indicated by the broken circle in FIG. 1.

As illustrated in FIG. 1, in the system heretofore known for vacuum braking, the wafer 12 traveling in a direction of arrow 13, will come to rest in one position. Alternatively, the wafer 18, traveling in the direction of arrow 17 will come to rest in a different position. Thus, the position which a stopped wafer occupies on the air track according to the system illustrated in FIG. 1 is dependent on the direction of wafer travel. Moreover, because the wafer is stopped by contacting the leading edge 16 of wafer 12, or the leading edge 20 of wafer 18 with the air track 10, the impact tends to create a crescent shape gouge in the track (not shown) and to chip or break the wafer (not shown). The latter is highly unsatisfactory in view of the considerable expense incurred in fabricating semiconductor wafers.

Turning now to the instant invention and referring to the remainder of the drawings wherein like reference numerals designate like or corresponding parts throughout the several views, there is generally illustrated in FIG. 2 the apparatus employed in the present invention wherein a pneumatically conveyed semiconductor wafer is evenly and uniformly stopped at a single position within a braking station on the track surface irrespective of the direction of wafer travel. Specifically, FIG. 2 shows a vacuum braking system containing braking stations employing the improved vacuum braking system in accordance with the invention.

As better seen in FIG. 3, the pneumatic conveyance system includes an air track 30 within a cover 32. Disposed beneath the track 30 and running the length thereof is a pair of gas pressure conduits 34. Conduits 34 communicate with orifices 36 disposed within the track 30 at intervals along the periphery thereof. Pressurized gas from a source (not shown) passes through conduits 34 and issues from the orifices 36 to maintain a predetermined atmosphere within the air track 32. Conduit 37 is connected to a source of pressurized gas (not shown). Pressurized gas flows through outlet apertures to support and propel the wafers along the air track 32.

Referring again to FIG. 2, a braking station 40 includes a pair of elongated air inlets 42a and 42b, which are disposed within the track 30 flush with a top surface 44 thereof. Also disposed within track 30 approximately coincident with a bottom surface 48 thereof is a vacuum manifold 46. Two pair of restricted passageways 50a and 50b, and 50c and 50d are disposed vertically within the track 30. One pair of the restricted passageways, specifically 50a and 50b communicates with the vacuum manifold 46 on one end and on the other with the elongated air inlet 42a. The other pair of restricted passageways, which is identical to the first pair, specifically 50c and 50d, communicate with the vacuum manifold 46 on one end and the elongated air inlet 42b on the other.

The vacuum manifold 46 communicates through vacuum conduit 52, a control valve 54 and a vacuum line 55 with a main vacuum conduit 56 which in turn communicates with a vacuum source (not shown). Control valve 54 is utilized to activate the station 40 by connecting a vacuum source (not shown) through appropriate conduits as later fully described, to the vacuum manifold 46 which in turn communicates with the elongated air inlets 42a and 42b by means of restrictive passageways 50a, 50b, 50c and 50d. Thus, a controlled regulated vacuum is applied through elongated air inlets 42a and 42b, creating a vacuum action substantially coincident with the mouths of the inlets of the surface of the track 30.

Figure 4:
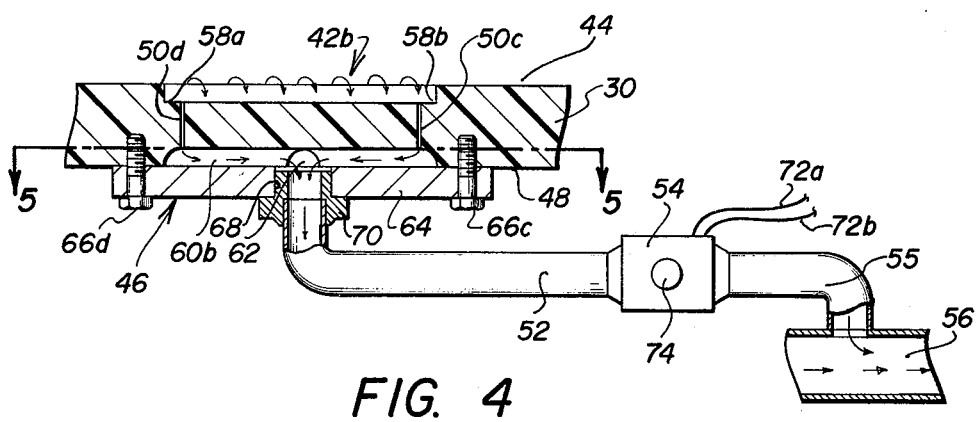
FIG. 4 is an elevated sectional view of the track illustrating a preferred embodiment.

More specifically, referring to FIG. 4, the elongated air inlet 42b has shoulder portions 58a and 58b. The inlet 42b is disposed within track 30 flush with the surface 44 thereof, such that the longitudinal dimension of the inlet is substantially parallel with the direction of travel of a wafer on the track 30. The longitudinal dimension or length of inlet 42b is about 1.00 inches and the lateral dimension or width is about 0.50 inches. A pair of restricted passageways 50c and 50d communicate with either end of the elongated air inlet 42b just inward of the shoulder portions 58a and 58b. The air inlet 42a is identical to 42b except that restricted passageways 50a and 50b communicate with either end of inlet 42a. The inlet 42a is disposed adjacent the inlet 42b, approximately parallel to the direction of wafer travel. The pair of elongated inlets 42a and 42b are symmetrically disposed within track 30 such that their center lines are approximately 60% of the slice diameter from one another.

It will be appreciated that the length and width of the air inlets used in accordance with the invention will depend upon the thickness and the surface area of the wafer to be stopped. Specifically, the elongation or lengthwise dimension of the air inlet is just slightly less than the lengthwise dimension of the wafer disposed directly over the inlet when the wafer is stopped and contacting the track. The width or lateral dimension of each inlet is determined by the thickness of the wafer to be stopped. Inlets having too great a width have too great an open area to properly support the stopped wafer, thus possibly causing it to crack or split. Further, various means for providing added support to the opening or mouth of the inlet to prevent cracking or the breaking of the wafer may be employed within the scope of the invention. The only criteria is that such support means not interfere substantially with the vacuum action.

As seen in FIG. 4, the restricted passageways 50c and 50d communicate between the ends of the elongated air inlet 42b and with the vacuum manifold 46. An identical pair of restrictive passageways 50a and 50b communicate in a similar manner with the ends of the elongated air inlet 42a and the vacuum manifold 46. Restricted passageways 50a, 50b, 50c and 50d are preferably tubular, having an inside diameter of about 0.062 inches.

The restricted passageways operate to regulate the air flow over the totality of the inlet in order to maintain a constant vacuum action at the mouth of each inlet. The use of restrictive passageways in accordance with the invention is particularly preferred when a single source of vacuum pressure is utilized in conjunction with a braking system having many braking stations. Specifically, the activation and deactivation of braking stations on a single vacuum line tends to fluctuate the vacuum pressure at the mouth of a particular inlet. Thus, utilizing restrictive passageways acts to stabilize a fluctuating air flow caused by variable vacuum.

Figure 5:
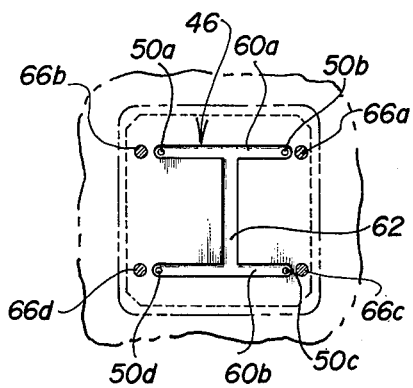
FIG. 5 is a top sectional view of the embodiment of FIG. 4 taken along line 5—5.

As better seen in FIG. 5, vacuum manifold 46 is of an "H" shaped configuration comprising a pair of elongated recesses 60a and 60b, which are identical in dimension to air inlets 42a and 42b. The recesses 60a and 60b are disposed in the track 30 flush with the bottom surface 48 thereof with recess 60a being reciprocally disposed directly underneath inlet 42a. Recesses 60b and inlet 42b are similarly situated. A cross member recess 62 communicates on one end with the recess 60a and on the other with the recess 60b. As better seen in FIG. 4, disposed on the bottom surface 48 of track 30 is a manifold bulkhead 64. The bulkhead 64 is sealingly fastened to the track by means of bolts 66a, 66b, 66c and 66d. Disposed approximately centrally of bulkhead 64 is a circular aperture 68 containing a flanged adapter 70. The flanged adapter allows sealed communication between the recess 62 and a vacuum conduit 52, thus completing the vacuum manifold 46.

Still referring to FIG. 4, the vacuum conduit 52 communicates with the valve 54. Valve 54 is of a remote control type, being controlled by means of control wires 72a and 72b, which are connected on one end to the valve and on the other to a switch on control panel (not shown). The valve 54 may be of any type known in the art such as the three-way, normally closed valve manufactured by Verson. When in the closed position, the valve 54 vents the conduit 52 to atmosphere through nipple 74. When the valve 54 is in the open position, a conduit 52 communicates with a vacuum source (not shown) through the vacuum line 55 and the main vacuum conduit 56.

In operation, the braking station 40 is normally deactivated. When deactivated, the valve 54 is in the closed position, maintaining atmospheric pressure at the mouth of the elongated air inlets 42a and 42b. When deactivated, braking station 40 does not appreciably effect a traveling wafer passing thereover. The braking station 40 is activated by opening the valve 54 on a signal passed through wires 72a and 72b. The valve 54 in the open position creates a vacuum within the braking station as previously described, causing an air flow in the direction of the arrows shown in FIG. 4. The air flow causes a vacuum action to be formed substantially around the vicinity of and about the mouth of inlets 42a and 42b.

The air thus entering the elongated inlets 42a and 42b passes through the restricted passageways 50a, 50b, 50c and 50d, wherein the air flow is regulated, and into the vacuum manifold 46. Within manifold 46, which communicates with the vacuum source as previously described, the vacuum pressure is equalized over the four restrictive passageways 50a, 50b, 50c and 50d.

When station 40 is activated, a wafer 38, as shown in FIG. 2, traveling in the direction of arrow 76 encounters a vacuum action as its leading edge 39 passes over the elongated inlets 42a and 42b, the vacuum action encountered is insufficient to pull the wafer 38 down. The wafer 38 continues to travel until substantially the entire undersurface of the wafer is subjected to the vacuum action. This position is shown in the left hand portion of FIG. 2 in braking station 90, which is identical station 40. The wafer is uniformly and evenly pulled onto the surface of air track 30 until substantially the entire undersurface of the water simultaneously contacts the track, stopping the wafer. As can be seen in the left hand portion of FIG. 2, the stopped wafer substantially covers the totality of the elongated air inlets disposed within station 90.

Likewise, a wafer 78 traveling in the direction of arrow 80, which has a leading edge 79, encounters the vacuum action in the vicinity of elongated inlets 42a and 42b. As shown in the left hand portion of FIG. 2, the wafer 78 is stopped in a position identical to the stopped position of wafer 38 with the wafer substantially covering the totality of the elongated recesses. Thus, as can be seen, a wafer traveling in either direction along air track 30 will be stopped at substantially the same position within an activated braking station.

In accordance with another embodiment of the instant invention as seen in FIG. 2, a braking station 100 is disposed centrally of an intersection of two air tracks. The braking station 100 comprises two pairs of elongated air inlets 142a and 142b, and 142c and 142d. The set of air inlets 142a and 142b are disposed perpendicular to the sets of inlets 142c and 142d, thus forming a square. Two sets of restricted passageways 150a, 150b, 150c and 150d communicate on one of their respective ends at the extreme end of a pair of recesses disposed at right angles, one to the other. The other ends of the restricted passageways communicate with a vacuum manifold 146. Manifold 146 is identical manifold 46, previously described. Manifold 146 communicates with a vacuum source through a controlled valve as previously described.

In operation, braking station 100 is activated, causing an air flow through elongated air inlets 142a, 142b, 142c and 142d simultaneously. A wafer 138 traveling in the direction indicated by arrow 176 or 180, or 182, or 184 will be stopped approximately at the position within braking station 100, as shown by the solid circle in FIG. 2, representing stopped wafer 138.

As can be seen from a careful examination of the drawings, braking station 100 essentially comprises two braking stations 40 disposed perpendicular one another to form a square. The four recesses communicate one with the other by means of common corners of the square. The restricted passageways 150a, 150b, 150c and 150d communicate with the elongated inlets at the corners, thus communicating with the elongated inlets simultaneously. All other parts and functions of station 100 are substantially identical to station 42, previously described.

Figure 6:
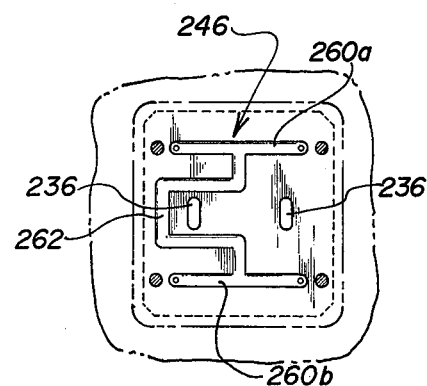
FIG. 6 is an alternative embodiment of the apparatus shown in FIG. 5.

In accordance with still another embodiment of the instant invention, as shown in FIG. 6, the vacuum manifold 46 may be replaced with a vacuum manifold 246. The vacuum manifold 246 is identical to manifold 46 except for cross member recess 262. As can be seen in FIG. 6, cross member recess 262 may incorporate a series of right angles to allow for example, pressure orifices 236 to be disposed centrally of the air track 30. It will be appreciated that the cross member recess 262 in accordance with the invention may be "plumbed" to allow other variations as needed.

Further, it will be realized that the restricted passageways 50a, 50b, 50c and 50d necessitate the utilization of the vacuum manifold 46 or the vacuum manifold 246. When little or no fluctuation in the vacuum pressure exits, direct connection between the vacuum source and the elongated inlets through the control valve is within the scope of the invention.

Having described the invention in connection with certain specific embodiments thereof, it is to be understood that further modifications may now suggest themselves to those skilled in the art and it is intended that such modifications as fall within the scope of the appended claims be covered.

What is claimed is:

1. A vacuum braking system for uniformly and evenly stopping the travel of a pneumatically conveyed semiconductor wafer at a single position within an activated braking station on an air track regardless of the direction of wafer travel comprising:
   a. a pair of elongated air inlets disposed within said braking station with the elongated portion of each of said inlets substantially parallel to the direction of wafer travel on said air track of and each inlet having a length slightly less than the lengthwise dimension of said wafer disposed directly over said elongated inlet when said wafer is stopped; and
   b. means for selectively supplying a vacuum to said elongated air inlets.

2. The system of claim 1 wherein said means for selectively supplying a vacuum comprises a vacuum source communicating through a valve means with said inlets.

3. The system of claim 2 further comprising means for regulating the air flowing through said elongated inlets.

4. The system of claim 3 wherein said means for regulating comprises a restricted passageway communicating between said vacuum source through said valve means and with each end of said elongated inlets.

5. The system of claim 4 wherein said valve means is a remote control valve which in the closed position vents said inlets to atmosphere.

6. The system of claim 5 further comprising a vacuum manifold communicating between said vacuum source through said remote control valve and said restricted passageways.

7. The system of claim 6 further comprising:
   a. a second pair of elongated air inlets identical with said first pair and being disposed at the intersection of two air tracks within a braking station with the elongated portion of the second pair of inlets perpendicular to the elongated portion of said first pair and so positioned as to form a single square inlet; and
   b. restrictive passageways communicating between the corners of said square inlet and said vacuum manifold.

8. In a vacuum braking system for stopping the travel of a wafer wherein a vacuum source communicates with air inlets disposed in an air track by means of a control valve, the improvement comprising:
   a pair of elongated air inlets disposed in said air track with the elongated portion of each inlet substantially parallel to said wafer travel on said track, and each inlet having a length slightly less than the lengthwise dimension of said wafer disposed directly over said elongated air inlet when said wafer is stopped.

9. The system of claim 8 further comprising pressure regulating passageways communicating between either end of each of said elongated air inlets and said vacuum source through said control valve.

10. The system of claim 9 further comprising a vacuum manifold communicating between said vacuum source through said control valve and said pressure regulating passageways.

11. The system of claim 10 further comprising:
   a. a second pair of elongated air inlets identical with said first pair and being disposed at the intersection of two air tracks within a braking station with the elongated portion of said second pair of inlets perpendicular to the elongated portion of said first pair and so as positioned as to form a single square inlet; and
   b. restrictive passageways communicating between the corners of said square inlet and said vacuum manifold.

12. The system of claim 11 wherein said valve means is a remote control valve which in the closed position vents said inlet to the atmosphere.

13. A vacuum braking system for uniformly and evenly stopping the travel of a pneumatically conveyed semiconductor wafer at a single position within an activated braking station on an air track regardless of the direction of wafer travel comprising:
   a. a vacuum source;
   b. remotely controlled valve means wherein a controlled side of said valve means is vented to atmosphere when said valve is in the closed position;
   c. a vacuum manifold disposed on the underneath side of said air track and communicating with said vacuum source through said controlled side of said remotely controlled valve means;
   d. a pair of elongated air inlets disposed within a braking station flush with the top surface of an air track wherein the elongated portion of each of said inlets is substantially parallel to the direction of said wafer travel on said air track and the length of each of said air inlets is slightly less than the lengthwise dimension of a wafer disposed directly over said elongated inlet when the wafer is stopped at said single position; and
   e. two pair of restrictive passageways, each pair communicating between the end of one of said elongated air inlets and said vacuum manifold.

14. The system of claim 13 further comprising a second pair of elongated inlets identical with said first pair and being disposed at the intersection of two air tracks within a braking station with the elongated portion of said second pair of inlets perpendicular to the elongated portion of said first pair and so positioned as to form a single square inlet.

15. The system of claim 14 wherein said two pair of restrictive passageways communicate between the corner of said square inlet and said vacuum manifold.

16. A vacuum braking system for uniformly and evenly stopping the travel of a pneumatically conveyed semiconductor wafer at a single position within an activated braking station at the intersection of two air tracks regardless of the direction of wafer travel comprising:
   a. A first pair of elongated air inlets disposed within said braking station with the elongated portion of said inlet substantially parallel to the direction of wafer travel on one of the air tracks at said intersection and having a length slightly less than the lengthwise dimension of the wafer disposed directly over the elongated inlet when the wafer is stopped;
   b. a second pair of elongated air inlets identical to said first pair disposed within said braking station with the elongated portions of said second pair substantially perpendicular to the elongated portions of said first pair and so positioned as to form a single square inlet; and c. means for selectively supplying a vacuum to said single square inlet.

17. The system of claim 16 wherein said means for selectively supplying a vacuum comprises a vacuum source communicating through a valve means with said square inlet.

18. The system of claim 17 further comprising a means for regulating the air flowing through said square inlet.

19. The system of claim 18 wherein said means for regulating comprises restrictive passageways communicating between the corners of said square inlet and said vacuum source through said valve means.

20. The system of claim 19 wherein said valve means is a remote control valve which in the closed position vents said square inlet to atmosphere.

21. The system of claim 20 further comprising a vacuum manifold communicating between said vacuum source through said remote control valve and said restrictive passageways.

* * * * *